US012690173B2

(12) United States Patent
He et al.

(10) Patent No.: US 12,690,173 B2
(45) Date of Patent: Jul. 21, 2026

(54) SYSTEM AIRFLOW BYPASSING RESTRICTED REAR I/O PANEL VIA POWER SUPPLY UNIT REGION

(71) Applicant: Dell Products L.P., Round Rock, TX (US)

(72) Inventors: Qinghong He, Austin, TX (US); Ting-Chiang Huang, New Taipei City (TW)

(73) Assignee: Dell Products L.P., Round Rock, TX (US)

( * ) Notice: Subject to any disclaimer, the term of this patent is extended or adjusted under 35 U.S.C. 154(b) by 465 days.

(21) Appl. No.: 18/363,269

(22) Filed: Aug. 1, 2023

(65) Prior Publication Data
US 2025/0048598 A1 Feb. 6, 2025

(51) Int. Cl.
*H05K 7/20* (2006.01)

(52) U.S. Cl.
CPC .............................. *H05K 7/20736* (2013.01)

(58) Field of Classification Search
CPC ................................................. H05K 7/20736
USPC ........................................................ 454/184
See application file for complete search history.

(56) References Cited

U.S. PATENT DOCUMENTS

| | | | | |
|---|---|---|---|---|
| 6,034,870 A * | 3/2000 | Osborn | .................... | G06F 1/20 |
| | | | | 361/679.48 |
| 7,345,873 B2 * | 3/2008 | Dey | ......................... | G06F 1/20 |
| | | | | 361/691 |
| 8,164,900 B2 * | 4/2012 | Sun | .......................... | G06F 1/20 |
| | | | | 361/695 |
| 8,953,326 B2 * | 2/2015 | Peng | ................... | H05K 7/1489 |
| | | | | 361/727 |
| 11,558,982 B2 * | 1/2023 | Kulkarni | ............ | H05K 7/20727 |
| 2004/0085727 A1 * | 5/2004 | Kim | .................. | H05K 7/20172 |
| | | | | 361/709 |
| 2013/0033816 A1 * | 2/2013 | Fu | ............................ | G06F 1/20 |
| | | | | 361/679.48 |
| 2017/0300091 A1 * | 10/2017 | Elwany | ................... | H05K 7/18 |
| 2023/0229212 A1 * | 7/2023 | Tunks | .................. | G05B 15/02 |
| | | | | 700/300 |

* cited by examiner

*Primary Examiner* — Avinash A Savani
*Assistant Examiner* — Dana K Tighe
(74) *Attorney, Agent, or Firm* — McDermott Will & Schulte LLP

(57) ABSTRACT
In one or more embodiments, a chassis may be formed with a side vent in a wall separating a main section with a plurality of components and a side section comprising a power supply unit (PSU) assembly. A main fan may generate a first airflow through the chassis and a PSU fan may generate a second airflow through the PSU housing. A side vent in the wall allows a portion of the first airflow to exit the chassis either through the PSU housing or via the side vent if the PSU housing is recessed.

15 Claims, 6 Drawing Sheets

100

SYSTEM AIRFLOW BYPASSING RESTRICTED REAR I/O PANEL VIA POWER SUPPLY UNIT REGION

BACKGROUND

Field of the Disclosure

This disclosure relates generally to cooling information handling systems and more particularly to cooling servers positioned in a server rack.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Embodiments may be directed to a system for cooling an information processing system in a chassis. The system comprises a main fan for drawing air through a front vent and generating a first airflow past a set of components in the chassis towards a back vent to an ambient environment; a Power Supply Unit (PSU) fan in a PSU housing for generating a second airflow to transfer heat generated by a PSU through a PSU vent to the ambient environment; and a wall between the PSU housing and the set of components in the chassis, wherein the wall comprises a side vent, wherein a first portion of the first airflow exits the chassis through the back vent and a second portion of the first airflow flows through the side vent in the wall. In some embodiments, the side vent is more than 50% open. In some embodiments, the side vent comprises a plurality of openings. In some embodiments, the PSU fan is proximate the PSU rear vent; a length of the side vent is substantially equal to the distance the PSU is recessed from the PSU rear vent; and the second portion of the first airflow flows through the side vent and exits the chassis through the PSU rear vent. In some embodiments, the PSU fan is proximate the PSU; a length of the side vent is substantially equal to the distance the PSU fan is recessed from the PSU rear vent; and the second portion of the first airflow flows through the side vent and exits the chassis through the PSU rear vent. In some embodiments, the PSU housing is recessed a distance from the PSU vent; and the side vent and the PSU rear vent form a cutout in the chassis, wherein the second portion of the first airflow flows through the side vent and exits the chassis through the cutout.

Embodiments may be directed to a chassis comprising: a main fan for drawing air through a front vent and generating a first airflow past a set of components in the chassis towards a back vent to an ambient environment; a Power Supply Unit (PSU) fan in a PSU housing for generating a second airflow to transfer heat generated by a PSU through a PSU vent to the ambient environment; and a wall between the PSU housing and the set of components in the chassis, wherein the wall comprises a side vent, wherein a first portion of the first airflow exits the chassis through the back vent and a second portion of the first airflow flows through the side vent in the wall. In some embodiments, the side vent is more than 50% open. In some embodiments, the side vent comprises a plurality of openings. In some embodiments, the PSU fan is proximate the PSU rear vent; a length of the side vent is substantially equal to the distance the PSU is recessed from the PSU rear vent; and the second portion of the first airflow flows through the side vent and exits the chassis through the PSU rear vent. In some embodiments, the PSU fan is proximate the PSU; a length of the side vent is substantially equal to the distance the PSU fan is recessed from the PSU rear vent; and the second portion of the first airflow flows through the side vent and exits the chassis through the PSU rear vent. In some embodiments, the PSU housing is recessed a distance from the PSU vent; and the side vent and the PSU rear vent form a cutout in the chassis, wherein the second portion of the first airflow flows through the side vent and exits the chassis through the cutout.

Embodiments may be directed to a server rack comprising: a plurality of chassis, each chassis separated from an adjacent chassis by a gap, each chassis comprising: a main fan for drawing air through a front vent and generating a first airflow past a set of components in the chassis towards a back vent to an ambient environment; a Power Supply Unit (PSU) fan in a PSU housing for generating a second airflow to transfer heat generated by a PSU through a PSU vent to the ambient environment; and a wall between the PSU housing and the set of components in the chassis, wherein the wall comprises a side vent, wherein a first portion of the first airflow exits the chassis through the back vent and a second portion of the first airflow flows through the side vent in the wall.

In some embodiments, the side vent is more than 50% open. In some embodiments, the side vent comprises a plurality of openings. In some embodiments, the PSU fan is proximate the PSU rear vent; a length of the side vent is substantially equal to the distance the PSU is recessed from the PSU rear vent; and the second portion of the first airflow flows through the side vent and exits the chassis through the PSU rear vent. In some embodiments, the PSU fan is proximate the PSU; a length of the side vent is substantially equal to the distance the PSU fan is recessed from the PSU rear vent; and the second portion of the first airflow flows through the side vent and exits the chassis through the PSU rear vent. In some embodiments, the PSU housing is recessed a distance from the PSU vent; and the side vent and the PSU rear vent form a cutout in the chassis, wherein the second portion of the first airflow flows through the side vent and exits the chassis through the cutout.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1:
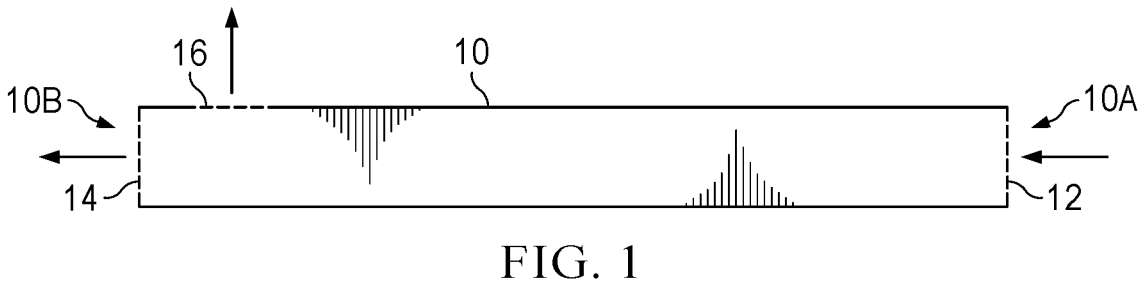
FIG. 1 depicts a side view of an example chassis of an information handling system, illustrating possible unrestricted airflow through a stand-alone server.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

An information handling system (IHS) may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, an IHS may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS may include or have a form factor of that of or similar to one or more of a laptop, a notebook, a telephone, a tablet, and a PDA, among others. For example, a portable IHS may be readily carried and/or transported by a user (e.g., a person). In one or more embodiments, components of an IHS may include one or more storage devices, one or more communications ports for communicating with external devices as well as various input and output (I/O) devices, such as a keyboard, a mouse, and a video display, among others. In one or more embodiments, IHS may include one or more buses operable to transmit communication between or among two or more hardware components. In one example, a bus of an IHS may include one or more of a memory bus, a peripheral bus, and a local bus, among others. In another example, a bus of an IHS may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit (I2C) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, an IHS may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

An IHS may include a processor, a volatile memory medium, non-volatile memory media, an I/O subsystem, and a network interface. Volatile memory medium, non-volatile memory media, I/O subsystem, and network interface may be communicatively coupled to processor. In one or more embodiments, one or more of volatile memory medium, non-volatile memory media, I/O subsystem, and network interface may be communicatively coupled to processor via one or more buses, one or more switches, and/or one or more root complexes, among others. In one example, one or more of a volatile memory medium, non-volatile memory media, an I/O subsystem, a and network interface may be communicatively coupled to the processor via one or more PCI-Express (PCIe) root complexes. In another example, one or more of an I/O subsystem and a network interface may be communicatively coupled to processor via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

A volatile memory medium may include volatile storage such as, for example, RAM, DRAM (dynamic RAM), EDO RAM (extended data out RAM), SRAM (static RAM), etc. One or more of non-volatile memory media may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, a network interface may be utilized in communicating with one or more networks and/or one or more other information handling systems. In one example, network interface may enable an IHS to communicate via a network utilizing a suitable transmission protocol and/or standard. In a second example, a network interface may be coupled to a wired network. In a third example, a network interface may be coupled to an optical network. In another example, a network interface may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, a network interface may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, a processor may execute processor instructions in implementing at least a portion of one or more systems, at least a portion of one or more flowcharts, at least a portion of one or more methods, and/or at least a portion of one or more processes. In one example, a processor may execute processor instructions from one or more memory media in implementing at least a portion of one or more systems, at least a portion of one or more flowcharts, at least a portion of one or more methods, and/or at least a portion of one or more processes. In another example, a processor may execute processor instructions via a network interface in implementing at least a portion of one or more systems, at least a portion of one or more flowcharts, at least a portion of one or more methods, and/or at least a portion of one or more processes.

In one or more embodiments, a processor may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, a processor may interpret and/or execute program instructions and/or process data stored locally (e.g., via memory media and/or another component of an IHS). In another example, a processor may interpret and/or execute program instructions and/or process data stored remotely (e.g., via a network storage resource).

In one or more embodiments, an I/O subsystem may represent a variety of communication interfaces, graphics interfaces, video interfaces, user input interfaces, and/or peripheral interfaces, among others. For example, an I/O subsystem may include one or more of a touch panel and a display adapter, among others. For instance, a touch panel may include circuitry that enables touch functionality in conjunction with a display that is driven by a display adapter.

A non-volatile memory medium may include an operating system (OS) and applications (APPs). In one or more embodiments, one or more of an OS and APPs may include processor instructions executable by a processor. In one example, a processor may execute processor instructions of one or more of OS and APPs via a non-volatile memory medium. In another example, one or more portions of the processor instructions of one or more of an OS and APPS may be transferred to a volatile memory medium and a processor may execute the one or more portions of the processor instructions.

Non-volatile memory medium may include information handling system firmware (IHSFW). In one or more embodiments, IHSFW may include processor instructions executable by a processor. For example, IHSFW may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, a processor may execute processor instructions of IHSFW via non-volatile memory medium. In another instance, one or more portions of the processor instructions of IHSFW may be transferred to volatile memory medium, and processor may execute the one or more portions of the processor instructions of IHSFW via volatile memory medium.

Embodiments may effectively remove heat from a chassis and may also reduce materials needed to manufacture an efficient cooling system.

Turning now to FIG. 1, a chassis 10 for an information handling system is depicted in a stand-alone server configuration. As depicted in FIG. 1, chassis 10 may have first end 10A configured with a single intake vent 12 for receiving airflow and second end 10B configured with a back vent 14 and top vent 16 for exhausting an airflow. A fan (not shown)

may draw air in through intake vent 12 and force the airflow across components in a main area before the airflow exits back vent 14 and top vent 16 at second end 10B of chassis 10. As depicted in FIG. 1, an airflow of approximately 137 CFM (cubic feet per minute) may enter intake vent 12, a first portion (e.g., approximately 82 CFM) of an exit airflow may exit back vent 14 and a second portion (e.g., approximately 55 CFM) of the exit airflow may exit top vent 16.

Figure 2:
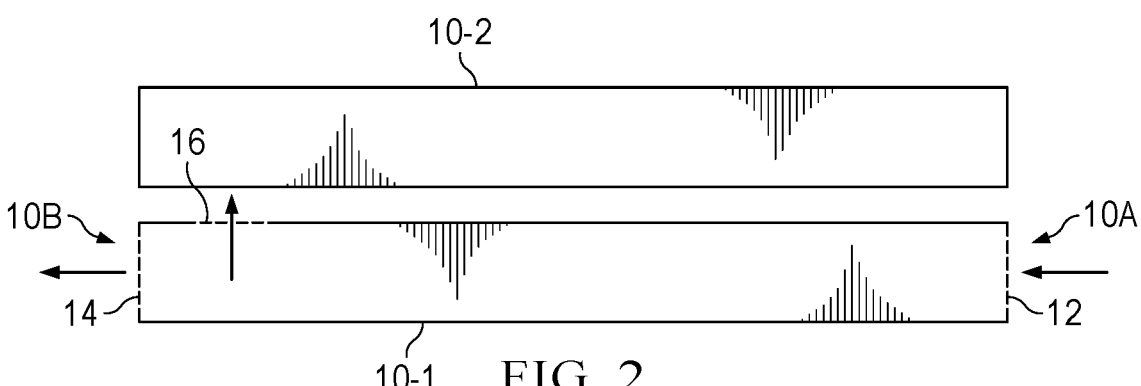
FIG. 2 depicts a side view of an example chassis of an information handling system, illustrating possible airflow restricted due to positioning the information handling system in a rack and separated by another information handling system by a gap of about 1 millimeter (mm)
Figure 3:
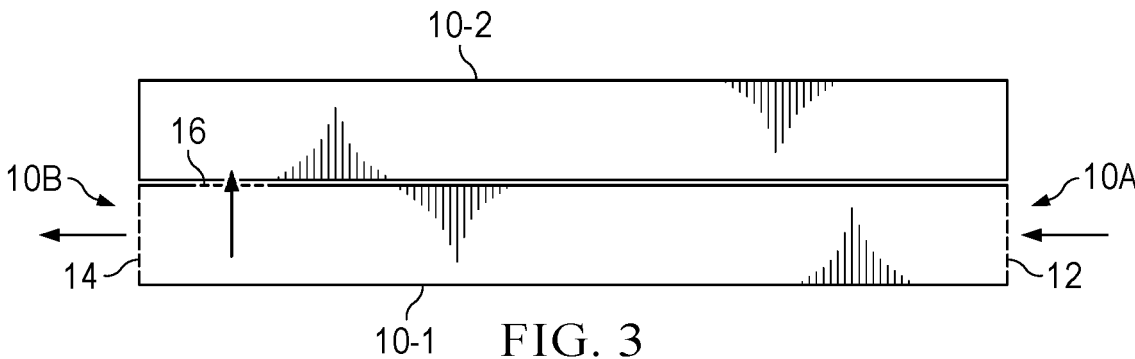
FIG. 3 depicts a side view of an example chassis of an information handling system, illustrating possible airflow restricted due to positioning the information handling system in a rack and separated by another information handling system by a gap of about 0 millimeter (mm)

Turning now to FIGS. 2 and 3, multiple chassis 10 may be arranged in a server rack (e.g., chassis 10-2 may be stacked on top of adjacent chassis 10-1). Each chassis 10 may have first end 10A configured with a single intake vent 12 for receiving airflow and second end 10B configured with a back vent 14 and top vent 16 for exhausting an airflow. However, the proximity of adjacent chassis 10-2 may reduce the amount of airflow through chassis 10-1. As depicted in FIG. 2, for a separation distance of approximately 1 mm (millimeter) between adjacent chassis 10-1 and 10-2, a fan operating at the same setting as a fan operating in chassis 10 in FIG. 1 may generate an airflow of approximately 104 CFM (cubic feet per minute), wherein the first portion (e.g., approximately 94 CFM) of the airflow may exit back vent 14 and the second portion (e.g., approximately 9.9 CFM) of the airflow may exit top vent 16. As depicted in FIG. 3, for a configuration with no separation (e.g., a separation distance of approximately 0 mm (millimeters) between adjacent chassis 10-1 and 10-2), a fan operating at the same setting as a fan operating in chassis 10 in FIG. 1 may generate an airflow of approximately 95 CFM (cubic feet per minute), wherein a first portion (e.g., approximately 95 CFM) of the exit airflow may exit back vent 14 but no second portion (e.g., approximately 0 CFM) of the airflow can exit top vent 16.

Attaining enough airflow through chassis 10 is critical to cool components. Running a fan faster, a common approach achieving more airflow, becomes less efficient as the fan power itself already accounts for a large portion of server power budget. Reducing airflow impedance could be an attractive alternative direction to increase airflow, however reducing airflow impedance usually means more open spaces in chassis 10, which might not be possible. Back vent 14 is generally a main airflow choking point due to the limited open area. Back vent 14 is generally planar and all airflow exits chassis 10 in a direction orthogonal to back vent 14.

Embodiments disclosed herein include chassis designs with minimum impact to server space efficiency but with lower airflow impedances in high density servers by rerouting a large amount of system airflow through a section of chassis 10 associated with a power supply unit. In some embodiments, a portion of an airflow may flow towards power supply unit (PSU) region(s) which are less restricted.

Figure 4:
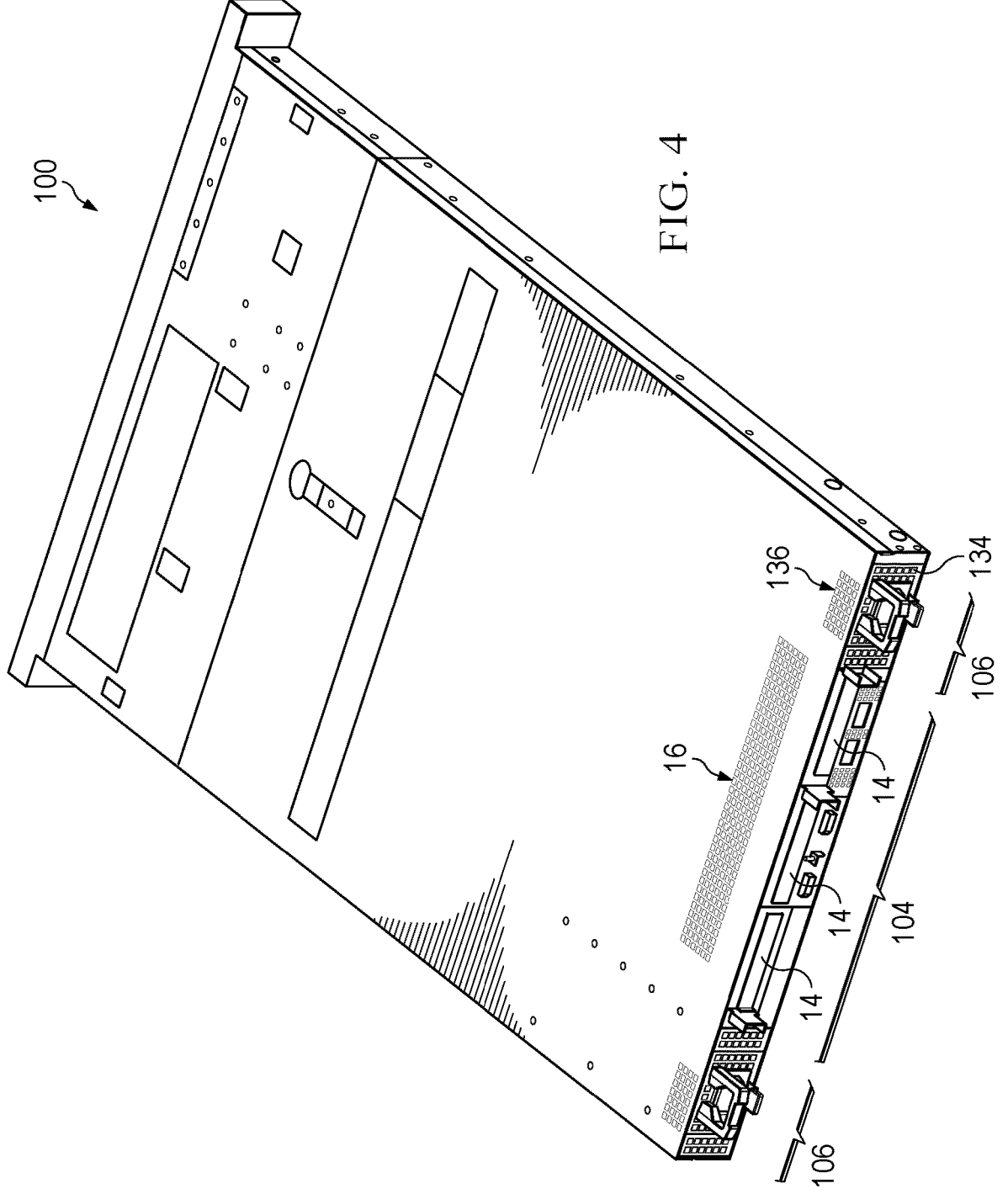
FIG. 4 depicts a perspective view of a chassis for an information handling system, illustrating a back vent and two side vents arranged generally coplanar.
Figure 5:
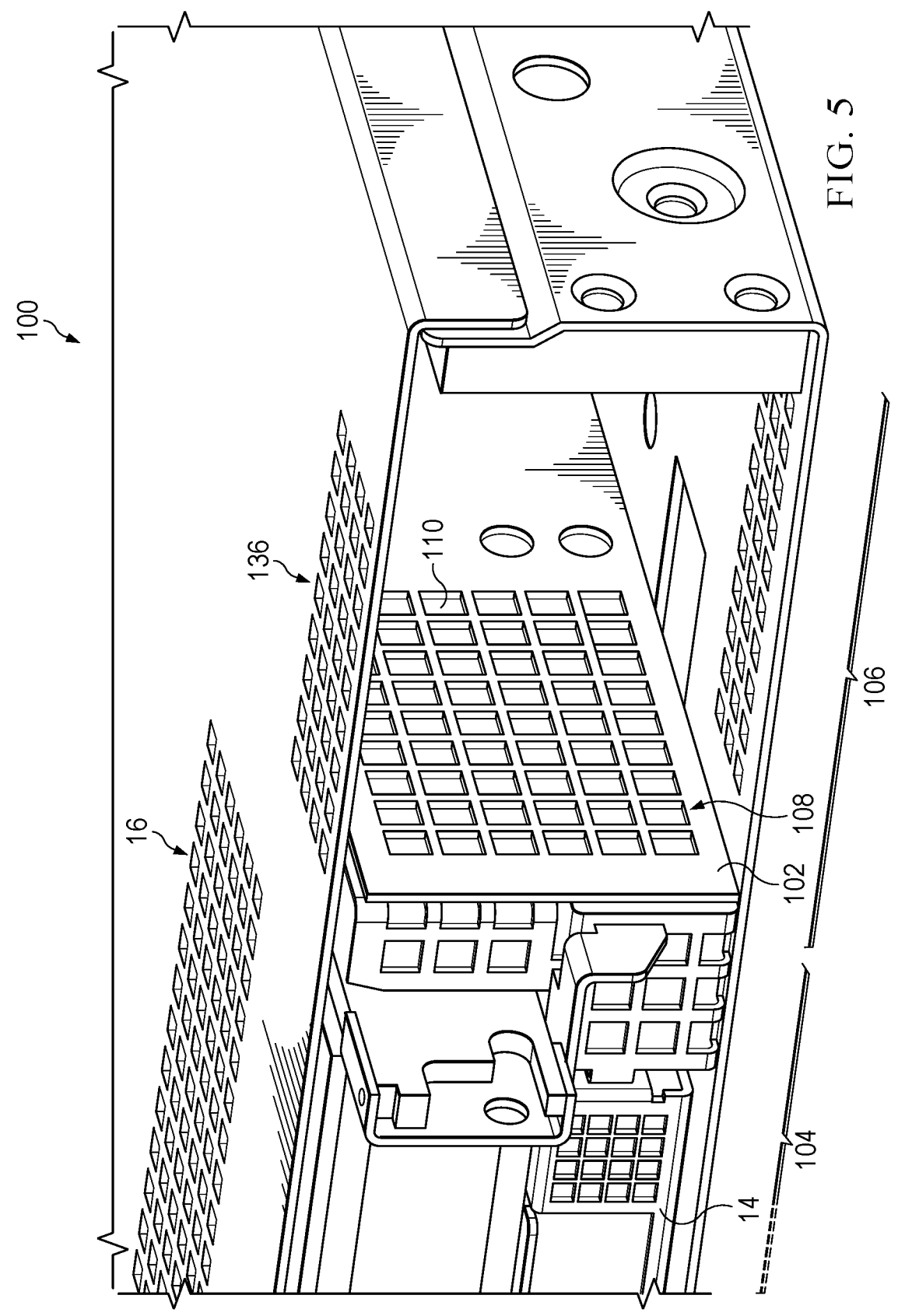
FIG. 5 depicts a partial perspective view of a chassis, illustrating a wall separating a main section from a side section associated with a power supply unit.

Turning to FIGS. 4 and 5, embodiments of chassis 100 may be configured with wall 102 dividing chassis 100 into a main section 104 and one or more side sections 106. Air may enter chassis 100 through a first (e.g., intake) vent 12 and flow through chassis 100 to cool components installed in main section 104. A first portion of a main airflow may exit chassis 100 through a first set of back vents 14 located in main section 104 and a second portion of the main airflow may exit chassis 100 via a second set of vents (e.g., side vents) to one or more side sections 106. If chassis 100 is used as a stand-alone server, a third portion of the main airflow may exit chassis 100 through a third set of vents (e.g., top vents 16 as described above).

Referring to FIG. 5, in some embodiments, side section 106 may be associated with a power supply unit (PSU)

assembly, discussed in greater detail below. In some embodiments, wall 102 may be formed with side vent 108 to allow a portion of a main airflow to flow from main section 104 of chassis 100 to side section 106. As depicted in FIG. 5, in some embodiments, side vent 108 may comprise a plurality of openings 110. In some embodiments, side vent 108 may be formed with one or more openings 110 such that side vent 108 is more than 50% open.

PSU Assembly

Figure 6:
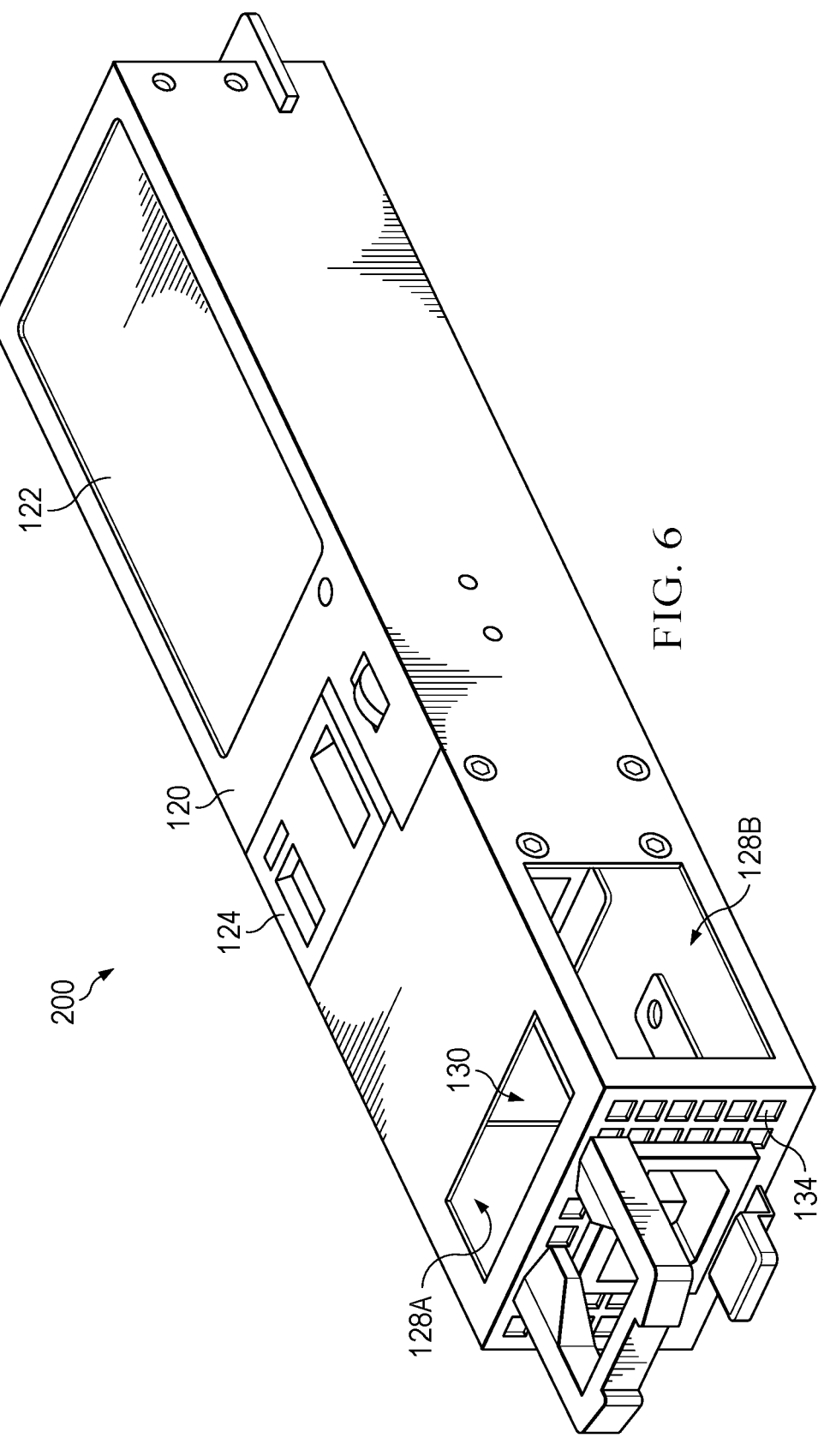
FIG. 6 depicts a perspective view of an example power supply unit assembly.

Referring to FIG. 6, PSU assembly 300 may comprise PSU housing 120 containing PSU 122 and PSU fan 124. PSU fan 124 may be positioned at any location in PSU housing 120 between PSU 122 and rear vent 134. PSU housing 120 may comprise one or more lateral vents 128, top vent 130 and rear vent 134. PSU fan 124 may generate an airflow through PSU housing 120 to cool PSU 122. Each of one or more lateral vents 128, top vent 130 and rear vent 134 may comprise a single opening or a plurality of openings. In some embodiments, the one or more openings may provide at least 50% open space in PSU housing 120, enabling greater airflow through PSU hosing 120.

PSU Components May be Recessed Inside PSU Housing

Figure 7:
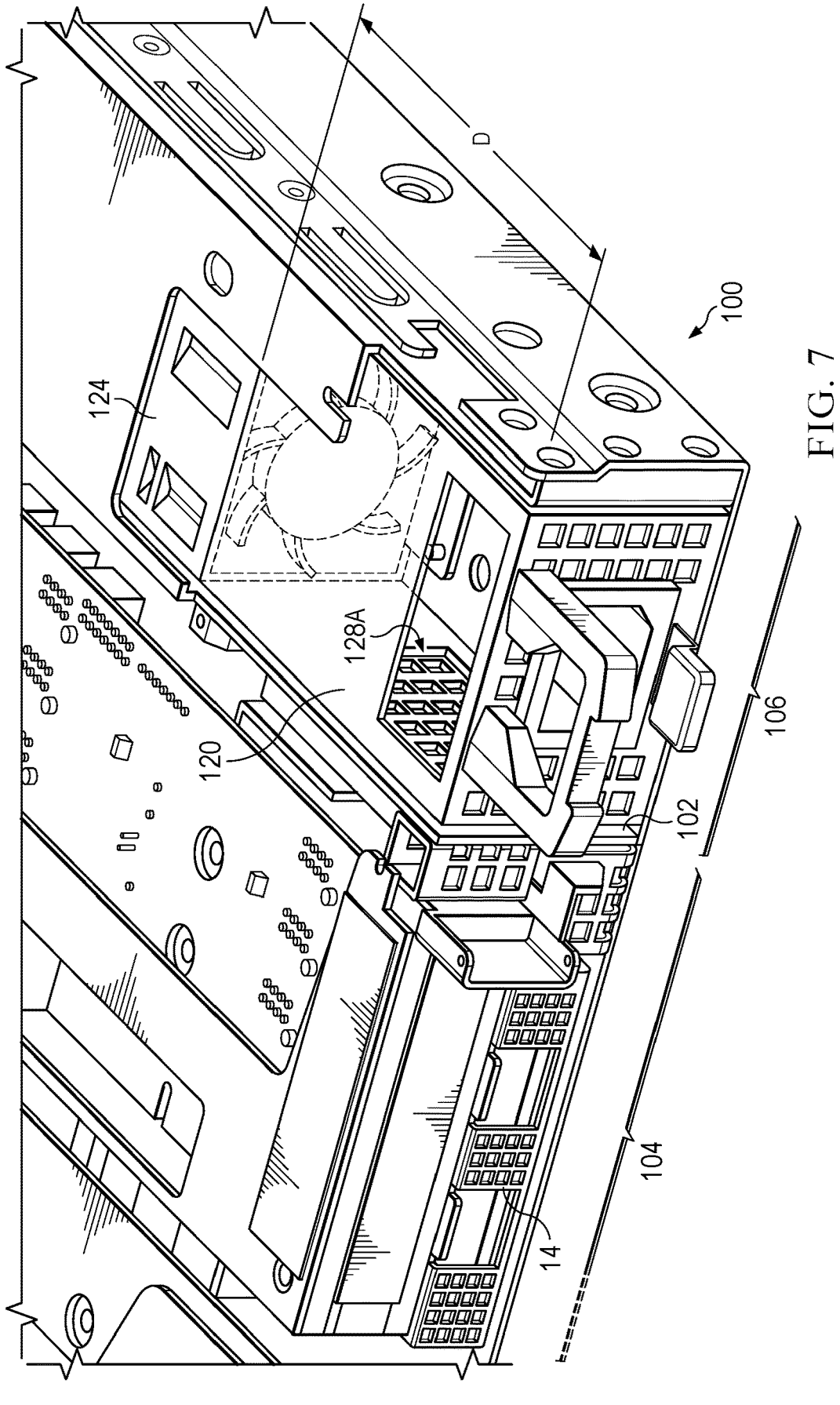
FIG. 7 depicts a cutaway partial perspective view of a chassis with a power supply unit assembly positioned in a side section.

Referring to FIG. 7, in some embodiments, chassis 200 may be configured with rear vent 134 of PSU housing 120 approximately coplanar with back vent 14, wherein one or more PSU components (e.g., PSU 122 and PSU fan 124) may be recessed a distance from rear vent 134. For example, in some embodiments, PSU fan 124 may be recessed from rear vent 134 by distance D, wherein one or more openings 110 in wall 102 may be aligned with side openings 128 in PSU housing 120. In other embodiments (not shown), PSU fan 124 may be proximate rear vent 134 but PSU 122 may be recessed from rear vent 134 by distance D and one or more openings 110 in wall 102 may be aligned with side openings 128 in PSU housing 120.

PSU Housing May be Recessed from a Back Vent and Chassis May be Cut Out

Figure 8:
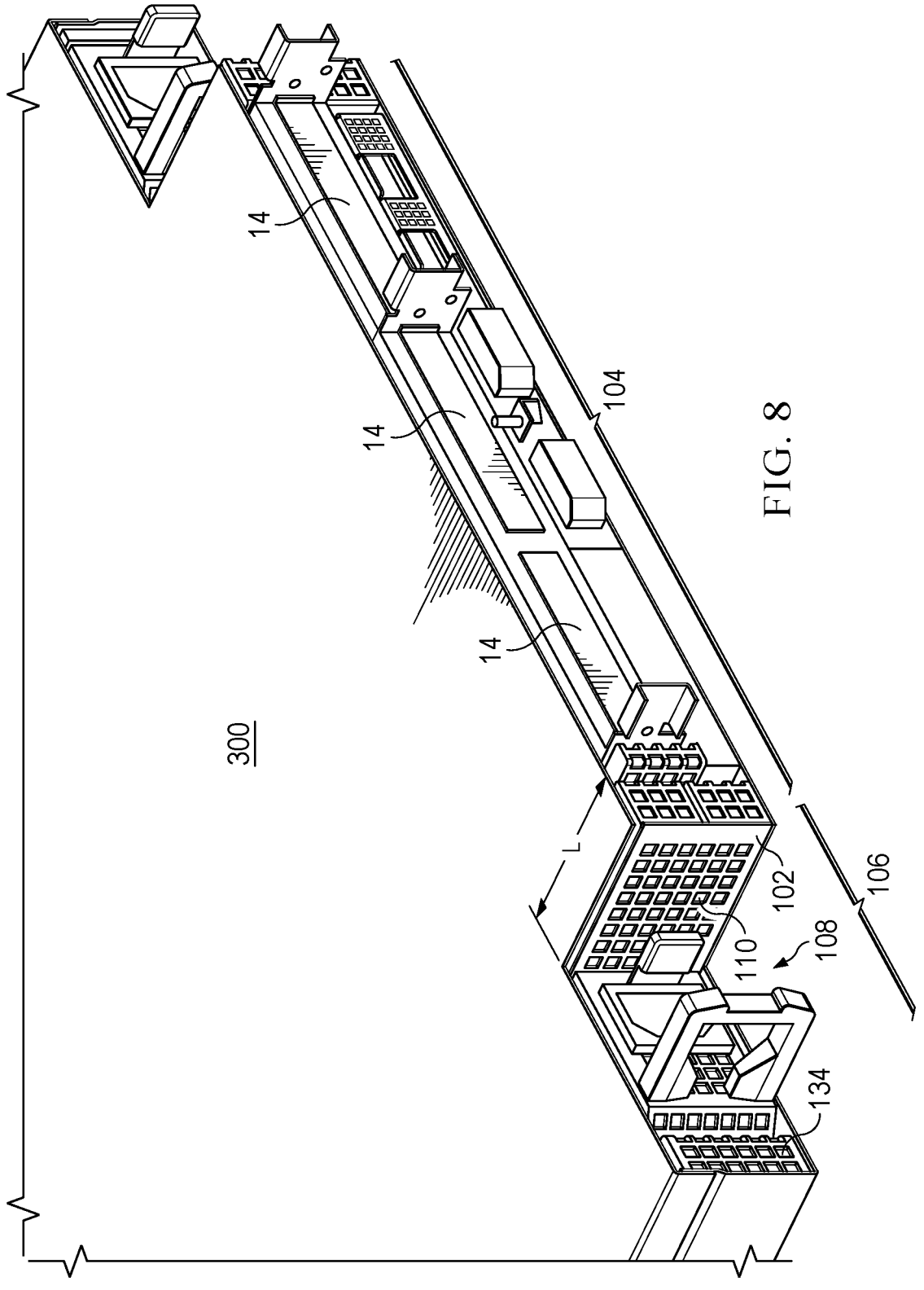
FIG. 8 depicts a partial perspective view of one embodiment of a chassis with a PSU assembly recessed from a back vent.

Referring to FIG. 8, in some embodiments, PSU assembly 300 may be recessed (e.g., not coplanar) relative to back vent 14 associated with main section 104, forming a cutout. In this configuration, an airflow generated by PSU fan 124 may exit rear vent 106, a first portion of a main airflow may exit back vents 14 in main section 104 and a second portion of the main airflow may exit side vent 108 to exit chassis 100. In some embodiments, side section 202 may comprise wall 102 with one or more openings 110. In some embodiments, the one or more openings 110 may provide at least 50% open space in wall 102 for reduced impedance.

Simulation showed an increase of 20% to 30% airflow may be achievable in chassis 100 positioned in a rack, which generally correlates to 20% to 30% more power support.

TABLE 1

| CHASSIS CONFIGURATION | STAND-ALONE SERVER | 1.5 MM GAP | 1.0 MM GAP | 0 MM GAP |
|---|---|---|---|---|
| BACK/REAR VENTS COPLANAR | 137 CFM | 110 CFM | 105 CFM | 95 CFM |
| BACK VENTS + SIDE VENTS | 142 CFM | 132 CFM | 130 CFM | 126 CFM |
| CHANGE (+/−) | | +4% | +20% | +24% | +33% |

As depicted in Table 1, for embodiments configured as a stand-alone server, configuring chassis 100 such that a portion of the main airflow exits the main section 104 through side vents 108 in wall 102 may increase airflow by about 4%. However, for embodiments configured for use in a rack, table 1 illustrates that configuring chassis 100 such that a portion of the main airflow exits the main section 104 through side vents 108 in wall 102 may increase airflow by about 20% for a 1.5 mm gap, about 24% for a 1.0 mm gap and about 33% for no gap.

Advantageously, embodiments may use air cooling to cool servers in power ranges that typically require more complex and more expensive liquid cooling.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A system for cooling an information processing system in a chassis, the system comprising:
   a main fan for drawing air through a front vent and generating a first airflow past a set of components in the chassis towards a back vent to an ambient environment;
   a Power Supply Unit (PSU) fan in a PSU housing for generating a second airflow to transfer heat generated by a PSU through a PSU vent to the ambient environment, the PSU fan proximate to the PSU vent; and
   a wall between the PSU housing and the set of components in the chassis, wherein the wall comprises a side vent, wherein a length of the side vent is substantially equal to a distance the PSU is recessed from the PSU vent, wherein a first portion of the first airflow exits the chassis through the back vent and a second portion of the first airflow flows through the side vent in the wall, the second portion of the first airflow flows through the side vent and exits the chassis through the PSU vent.

2. The system of claim 1, wherein the side vent is more than 50% open.

3. The system of claim 2, wherein the side vent comprises a plurality of openings.

4. The system of claim 1, wherein:
   the PSU fan is proximate the PSU;
   a length of the side vent is substantially equal to a distance the PSU fan is recessed from the PSU vent; and
   the second portion of the first airflow flows through the side vent and exits the chassis through the PSU vent.

5. The system of claim 1, wherein
   the PSU housing is recessed a distance from the PSU vent; and
   the side vent and the PSU vent form a cutout in the chassis, wherein the second portion of the first airflow flows through the side vent and exits the chassis through the cutout.

6. A chassis comprising:
   a main fan for drawing air through a front vent and generating a first airflow past a set of components in the chassis towards a back vent to an ambient environment;
   a Power Supply Unit (PSU) fan in a PSU housing for generating a second airflow to transfer heat generated by a PSU through a PSU vent to the ambient environment, the PSU fan proximate to the PSU vent; and a wall between the PSU housing and the set of components in the chassis, wherein the wall comprises a side vent, wherein a length of the side vent is substantially equal to a distance the PSU is recessed from the PSU vent, wherein a first portion of the first airflow exits the chassis through the back vent and a second portion of the first airflow flows through the side vent in the wall, the second portion of the first airflow flows through the side vent and exits the chassis through the PSU vent.

7. The chassis of claim 6, wherein the side vent is more than 50% open.

8. The chassis of claim 7, wherein the side vent comprises a plurality of openings.

9. The chassis of claim 6, wherein:
   the PSU fan is proximate the PSU;
   a length of the side vent is substantially equal to a distance the PSU fan is recessed from the PSU vent; and
   the second portion of the first airflow flows through the side vent and exits the chassis through the PSU vent.

10. The chassis of claim 6, wherein
   the PSU housing is recessed a distance from the PSU vent; and
   the side vent and the PSU vent form a cutout in the chassis, wherein the second portion of the first airflow flows through the side vent and exits the chassis through the cutout.

11. A server rack comprising:
   a plurality of chassis, each chassis separated from an adjacent chassis by a gap, each chassis comprising:
   a main fan for drawing air through a front vent and generating a first airflow past a set of components in the chassis towards a back vent to an ambient environment, the PSU fan proximate to the PSU vent;
   a Power Supply Unit (PSU) fan in a PSU housing for generating a second airflow to transfer heat generated by a PSU through a PSU vent to the ambient environment; and
   a wall between the PSU housing and the set of components in the chassis, wherein the wall comprises a side vent, wherein a length of the side vent is substantially equal to a distance the PSU is recessed from the PSU vent, wherein a first portion of the first airflow exits the chassis through the back vent and a second portion of the first airflow flows through the side vent in the wall, the second portion of the first airflow flows through the side vent and exits the chassis through the PSU vent.

12. The server rack of claim 11, wherein the side vent is more than 50% open.

13. The server rack of claim 12, wherein the side vent comprises a plurality of openings.

14. The server rack of claim 11, wherein:
   the PSU fan is proximate the PSU;
   a length of the side vent is substantially equal to a distance the PSU fan is recessed from the PSU vent; and
   the second portion of the first airflow flows through the side vent and exits the chassis through the PSU vent.

15. The server rack of claim 11, wherein
   the PSU housing is recessed a distance from the PSU vent; and
   the side vent and the PSU vent form a cutout in the chassis, wherein the second portion of the first airflow flows through the side vent and exits the chassis through the cutout.

* * * * *